US006946898B1

(12) United States Patent  
Kerth et al.

(10) Patent No.: US 6,946,898 B1  
(45) Date of Patent: Sep. 20, 2005

(54) SYSTEM AND METHOD FOR BIASING ELECTRICAL CIRCUITS

(75) Inventors: Donald A. Kerth, Austin, TX (US); Augusto M. Marques, Austin, TX (US); Dylan Hester, Austin, TX (US); Russell Croman, Austin, TX (US)

(73) Assignee: Silicon Laboratories, Inc., Austin, TX (US)

( * ) Notice: Subject to any disclaimer, the term of this patent is extended or adjusted under 35 U.S.C. 154(b) by 0 days.

(21) Appl. No.: 10/810,039

(22) Filed: Mar. 26, 2004

(51) Int. Cl.⁷ .............................................. H03K 3/01
(52) U.S. Cl. ..................................................... 327/530
(58) Field of Search ................ 327/530, 534, 327/535, 537, 538, 540, 541, 543, 545, 546

(56) References Cited

U.S. PATENT DOCUMENTS 6,226,506 B1   5/2001   Welland et al.
6,311,050 B1   10/2001  Welland et al.
2002/0168942 A1  11/2002  Scott et al.

OTHER PUBLICATIONS

Shur, Michael, "Principle of Operation of FETs", 1998.

*Primary Examiner*—Jeffrey Zweizig
(74) *Attorney, Agent, or Firm*—Mark P. Kahler

(57) ABSTRACT

A bias system is disclosed including a calibration bus to which a controller, a reference bias source, a master bias source, and first and second slave bias sources are coupled. The controller varies a control code sent over the calibration bus to the master bias source until a particular control code is found that causes the bias signal of the master bias source to equal a desired bias value which is provided by the reference bias source. The controller then sends the particular control code to the first and second slave bias sources to cause the first and second slave bias sources to generate a bias signal having the same desired bias value as the master bias source. Isolation between load circuits coupled to the first and second bias sources is thus enhanced while providing low noise, stable operation.

96 Claims, 7 Drawing Sheets

FIG. 4A $I_o = V_T[G_x + d_n g_n + d_{n-1} g_{n-1} + \ldots d_o g_o]$

FIG. 4B $V_1 = V_T[1 + R_1(G_x + d_n g_n + d_{n-1} g_{n-1} + \ldots d_o g_o]$

SYSTEM AND METHOD FOR BIASING ELECTRICAL CIRCUITS

TECHNICAL FIELD OF THE INVENTION

The disclosures herein relate generally to biasing electrical circuits and more particularly to biasing multiple stage electrical circuits.

BACKGROUND

Many high performance radio frequency (RF) and analog circuits need precision bias circuits to operate properly. Desirable bias circuit characteristics include low noise, low drift, high accuracy and substantial isolation from stage to stage. It is also desirable that bias circuits be adjustable. Adjustability in the bias circuit is especially relevant to RF circuits which often exhibit parasitics that can not be simulated when the RF circuit is fabricated in an integrated circuit form. Parasitics such as unintended capacitive, inductive and conductive effects can degrade a circuit's performance. An adjustable bias circuit is desirable to compensate for these unforeseen parasitics after manufacture.

One problem with analog-based bias networks is that high power dissipation and large silicon area consumption are often needed to obtain high accuracy, low noise and other high performance characteristics. Moreover, analog bias networks are not easily adjusted once they are fabricated. Another problem encountered with analog-based bias networks is that when a common bias source is used to bias multiple circuit stages, this tends to provide undesired coupling between the stages. For example, if two RF amplifiers are biased by a common voltage source or current source, this tends to result in undesired linkage between the two stages.

What is needed is a way to bias a circuit in a manner which permits adjustment of the bias while reducing undesired coupling among load circuits coupled to the bias circuit.

SUMMARY

Accordingly, in one embodiment, a method is disclosed for supplying bias including generating, by a reference bias source, a reference bias signal having a desired bias value. The method also includes calibrating an adjustable master bias source by sending the adjustable master bias source a control code which causes the adjustable master bias source to generate a master bias signal having the desired bias value. The method further includes calibrating adjustable slave bias sources by sending the control code to the adjustable slave bias sources to cause the adjustable slave bias sources to generate respective slave bias signals having the desired bias value.

In another embodiment, a bias system is disclosed including a calibration bus and a reference bias source, coupled to the calibration bus, to generate a bias signal having a desired bias value. The bias system also includes an adjustable master bias source, coupled to the calibration bus, to receive a control code which causes the adjustable master bias source to generate a master bias signal having the desired bias value. The bias system further includes adjustable slave bias sources which are coupled to the calibration bus. The adjustable slave bias sources receive the control code which causes the adjustable slave bias sources to generate slave bias signals having the desired bias value.

In yet another embodiment, an integrated circuit device is disclosed which includes a calibration bus and a reference bias source that is coupled to the calibration bus. The reference bias source generates a bias signal having a desired bias value. The integrated circuit device also includes an adjustable master bias source, coupled to the calibration bus, to receive a control code which causes the adjustable master bias source to generate a master bias signal having the desired bias value. The integrated circuit device further includes adjustable slave bias sources, coupled to the calibration bus, to receive the control code to cause the adjustable slave bias sources to generate slave bias signals having the desired bias value. The integrated circuit device also includes loads coupled to the adjustable slave bias sources. Loads can also be coupled to the adjustable master bias source.

BRIEF DESCRIPTION OF THE DRAWINGS

The appended drawings illustrate only exemplary embodiments of the invention and therefore do not limit its scope, because the inventive concepts lend themselves to other equally effective embodiments.

DETAILED DESCRIPTION

Figure 1A:
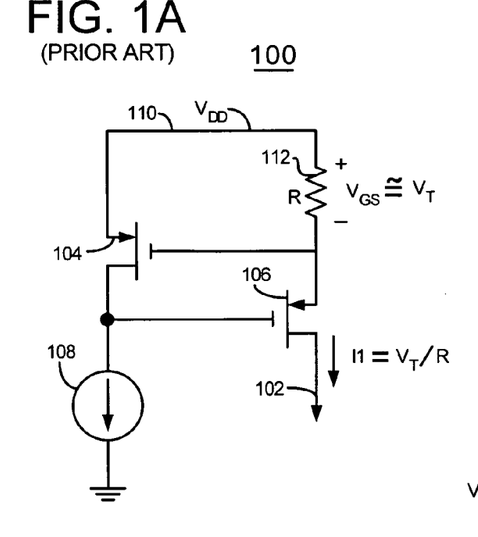
FIG. 1A is a schematic diagram of a conventional low noise current source.

FIG. 1A is a schematic diagram of a conventional low noise current source 100. Current source 100 produces an output current, I1, at output 102. MOSFETs 104 and 106 are coupled together and to current source 108 as shown to form a low noise but inaccurate current source 100. $V_{DD}$ is the voltage at supply voltage rail 110. The voltage across resistor 112, namely the voltage across the gate and source of MOSFET 104 is approximately equal to the transition voltage, $V_T$, of MOSFET 104. The output current I1 of current source 100 is equal to $V_T/R$ wherein R is resistor 112. While current source 100 exhibits low noise, unfortunately it tends to be inaccurate. An inaccurate current source is a current source that deviates or drifts from the output current for which it was designed.

Figure 1B:
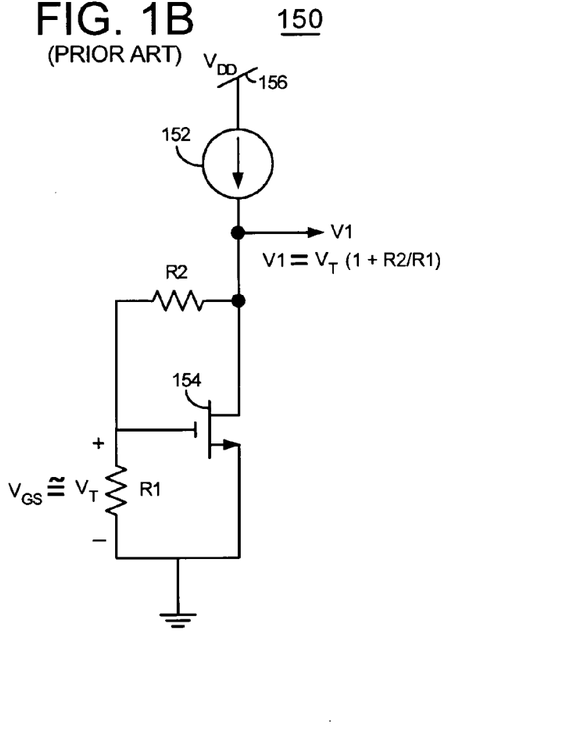
FIG. 1B is a schematic diagram of a conventional low noise voltage source.

FIG. 1B is a schematic diagram of a conventional low noise voltage source 150. Current source 152 is coupled in series with MOSFET 154 between $V_{DD}$ voltage rail 156 and ground to provide an output voltage, V1, as shown. In this voltage source circuit, output voltage V1 equals $V_T(1+R2/R1)$. While voltage source 150 exhibits low noise, unfortunately it also tends to be inaccurate. An inaccurate voltage source is a voltage source that deviates or drifts from the output voltage for which is was designed.

Both current source 100 and voltage source 150 provide good low noise performance while consuming relatively small wafer area and providing low power consumption. However, these sources tend to be highly inaccurate. The output current and output voltage both depend on the transition voltage, $V_T$, and tend to be highly process and temperature dependent. This tends to make current source 100 and voltage source 150 unusable for precision bias applications.

Figure 2:
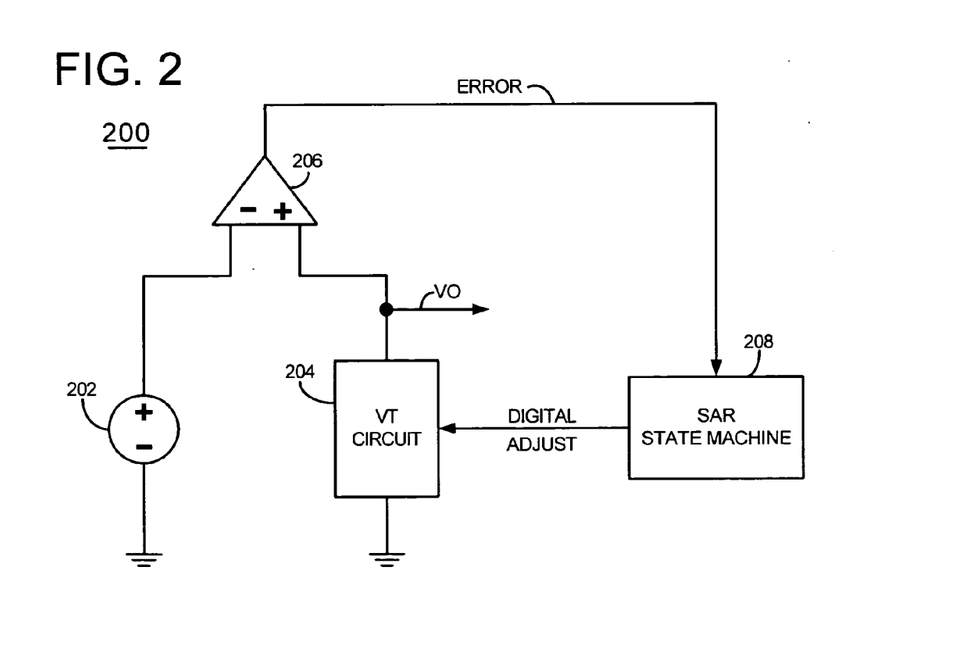
FIG. 2 is a block diagram of a voltage source circuit which is calibrated to provide both a low noise and highly accurate output voltage.

FIG. 2 is a block diagram of a voltage source circuit 200 which is calibrated to provide both a relatively low noise and relatively accurate output voltage. Voltage source circuit 200 includes a voltage source 202 which is a relatively accurate but relatively noisy voltage source. Voltage source circuit 200 also includes an inaccurate but quiet adjustable voltage source 204. One circuit that can be used as voltage source 204 is a $V_T$ voltage source circuit, such as the type shown in FIG. 1B. The outputs of voltage sources 202 and 204 are coupled to the inputs of a comparator 206. The output of comparator 206 generates an error signal, ERROR, which is fed to a successive approximation register (SAR) state machine 208. SAR state machine 208 is programmed to send a digital corrective signal DIGITAL ADJUST to adjustable voltage source 204 to change its output voltage, VO, to a value equal to the voltage of voltage source 202 or equal to the value of the voltage of voltage source 202 plus some offset. In this manner, the inaccurate but quiet voltage source 204 is calibrated by the accurate by noisy voltage source 202 to provide an accurate and quiet output voltage, VO. A representative successive approximation register (SAR) routine that can be used to perform the appropriate digital calibration or adjustments to the DIGITAL ADJUST signal and other source calibration circuit information is described in the commonly owned, copending patent application entitled "Calibrated Low-Noise Current and Voltage References and Associated Methods" by Jeffrey W. Scott et al., Ser. No. 10/081,121, the disclosure of which is incorporated herein by reference in its entirety.

If a calibrated analog voltage such as VO of FIG. 2 above is routed to multiple RF stages to provide bias thereto, this can cause undesired coupling among the stages. An alternative approach to biasing multiple stages is thus desirable.

Figure 3:
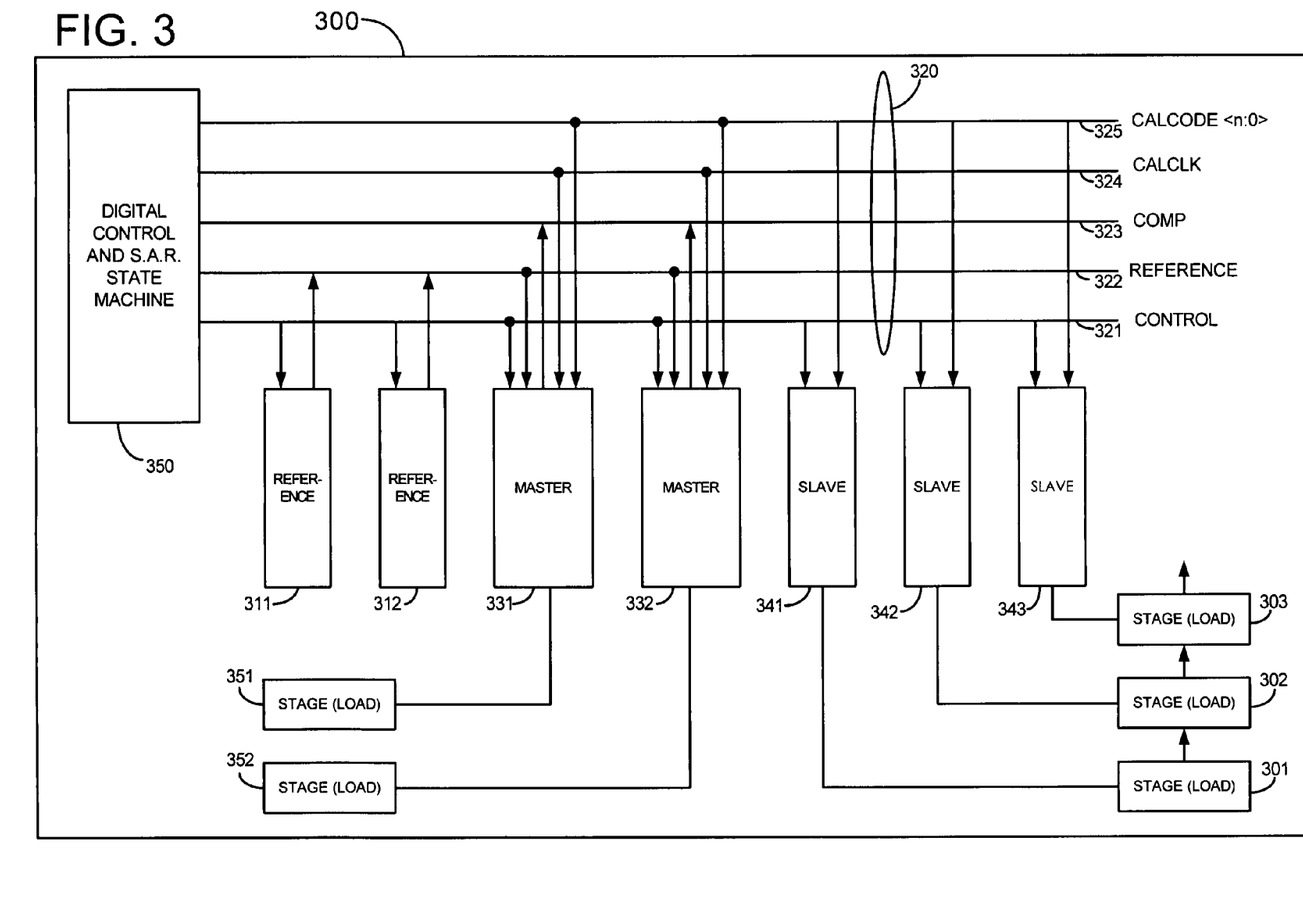
FIG. 3 is a block diagram of the disclosed bias system implemented as an integrated circuit.

FIG. 3 is a block diagram of the disclosed bias system 300 which is capable of biasing multiple stages or loads 301, 302 and 303 with high isolation among the stages or loads. Bias system 300 includes reference circuits 311 and 312. References 311 and 312 can be either voltage source references, current source references or a mix of voltage and current source references. References 311 and 312 are coupled to a CONTROL line 321 and a REFERENCE line 322 of a calibration bus 320. In one embodiment, references 321 and 322 are both accurate but noisy references. Bias system 300 also includes master source circuits 331 and 332. Master source circuits 331 and 332 can either be both voltage source circuits, both current source circuits or a mix of voltage and current source circuits. In one embodiment, master source circuits 331 and 332 are calibrated and quiet digitally adjustable source circuits as will be described later in detail. Bias system 300 also includes slave source circuits 341, 342 and 343. In one embodiment, slave source circuits 341, 342 and 343 are quiet digitally adjustable source circuits, as will be described later in detail. Slave source circuits 341, 342 and 343 can either be digitally adjustable voltage source circuits, digitally adjustable current source circuits or a mixture thereof. Slave source circuits 341, 342 and 343 are coupled to RF stages 301, 302 and 303, respectively, to provide bias thereto in a manner that avoids undesired coupling among these stages.

Bias system 300 operates as follows. For this example, it is assumed that reference source circuits 311 and 312 are each accurate but noisy voltage sources. Digital control and SAR state machine 350, referred to for convenience as controller 350, provide master source circuits 331 and 332 respective CALCODE signals over CALCODE line or bus 325, instructing master source circuits 331 and 332 to assume the same output voltage exhibited by reference circuits 311 and 312, respectively. In this manner the output voltages of master source circuits 331 and 332 are accurate and low noise voltages. Master source circuits 331 and 332 are now said to be calibrated to reference source circuits 311 and 312, respectively. CALCODE signals are also referred to a control signals.

In this particular example, slave source circuits 341 and 342 will effectively copy the output voltage of master 331 and slave source circuit 343 will effectively copy the output voltage of master 332. To achieve this end, the same CALCODE signal or code that caused master source circuit 331 to replicate the accurate voltage of reference 311 is sent to slave source circuits 341 and 342. Thus, slave source circuits 341 and 342 assume the same output voltage as master 331 assumed when it was calibrated. Slave source circuits 341 and 342 are coupled to RF stage 301 and RF stage 302, respectively, to provide bias thereto as shown in FIG. 3. Advantageously, this bias arrangement avoids undesired coupling between RF stage 301 and RF stage 302 since slaves 341 and 342 are separately digitally instructed with respect to the output voltage they are to exhibit. Slave source circuit 343 assumes the same output voltage as master 332 as instructed by the same CALCODE signal that resulted in master 332 assuming that voltage. It is noted that master 332 had earlier assumed the same output voltage as accurate by noisy reference 312. Slave source circuit 343 provides bias to RF stage 303 as shown. Although in this example reference circuits 311 and 312 are both reference voltage sources, it is also possible that current sources be used for either of, or both of, reference circuits 311 and 312. Of course, embodiments are possible wherein there are more than 2 reference circuits, more than 2 masters and more than 3 slaves. In one embodiment, bias system 300 is implemented as an integrated circuit. It is noted that loads can also be connected to the master source circuits. For example, master loads 351 and 352 are coupled to master source circuits 331 and 332, respectively, to provide bias thereto. It is also noted that a CALCODE may be reserved for a master source circuit and if so that CALCODE is not transmitted on the calibration bus to a slave source circuit.

Details are given below regarding reference source circuits 311 and 312, master source circuits 331 and 332, and slave source circuits 341, 342 and 343. However, before beginning that discussion, an adjustable $V_T$ current source and an adjustable $V_T$ voltage source are discussed that can be used as $V_T$ circuits in both the master source circuits and the slave source circuits.

Figure 4A:
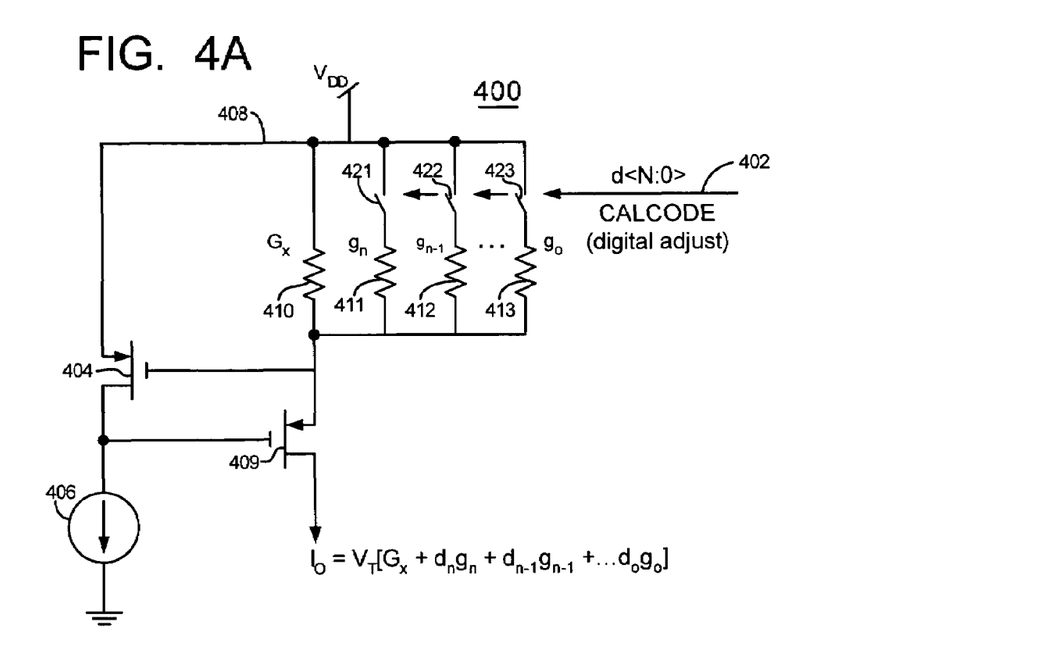
FIG. 4A is a schematic diagram of an adjustable current source that can be used in the disclosed bias system.

FIG. 4A is a schematic diagram of a digitally adjustable current source 400 which is supplied a CALCODE signal 402 to control the output current thereof. The CALCODE signal is also known as a digital adjust signal or code. In this embodiment, current source 400 is a $V_T$ circuit because output current $I_O$ is dependent on the transition voltage, $V_T$, of MOSFET 404. MOSFET 404 is coupled in series with a current source 406. Series coupled MOSFET 404 and current source 406 are coupled between power supply rail 408, which exhibits a voltage VDD, and ground as shown. Another MOSFET 409 is coupled to MOSFET 404 and current source 406 as shown. MOSFET 409 is also coupled to power rail 408 via a bank of conductors 410, 411, 412 and 413. More particularly, a fixed value conductor 410 is coupled between power rail 408 and the source of MOSFET 409. The value of fixed conductor 411 coarsely sets the output current, $I_O$, of adjustable current source 400. A bank of conductors 411, 412 and 413 are switched in parallel with conductor 410 to adjust the output current, $I_o$, to the value desired as instructed by the digital adjust CALCODE signal 402. More switchable conductances than the 3 shown in FIG. 4A can be used to achieve greater resolution or granularity in adjusting the magnitude of output current, $I_O$. The CALCODE signal is given by the expression d<N:0> wherein N+1 is the number of bits in the CALCODE signal. Conductors 411, 412, 413 each have a respective switch 421, 422 and 423, to control whether or not the corresponding conductor is switched into the circuit to affect the final value of the output current, $I_O$. In this particular embodiment, a different bit of the CALCODE signal is assigned to each switch respectively to determine whether or not the switch is closed. For example, if the CALCODE signal is a 3 bit word (i.e. N=2), the most significant bit (MSB) of which is 1, then switch 421 is closed and conductor 411 is connected. If the MSB had a value of 0, then switch 421 is open and conductor 411 remains unconnected. The output current, $I_O$, of this digitally adjustable $V_T$ circuit is given by the equation:

$$I_o = V_T[G_x + d_n g_n + d_{n-1} g_{n-1} + \ldots d_o g_o]$$

wherein $V_T$ is the transition voltage of MOSFET 404 and $G_x$ is the conductance of conductor 410, d is the CALCODE bit corresponding to the particular conductance and g is the conductance value of the conductor to which the respective CALCODE bit is to be applied. As mentioned earlier, the CALCODE bit corresponding to each conductor determines whether or not the switch corresponding to that conductor is turned on to affect the final output current value, $I_O$.

Figure 4B:
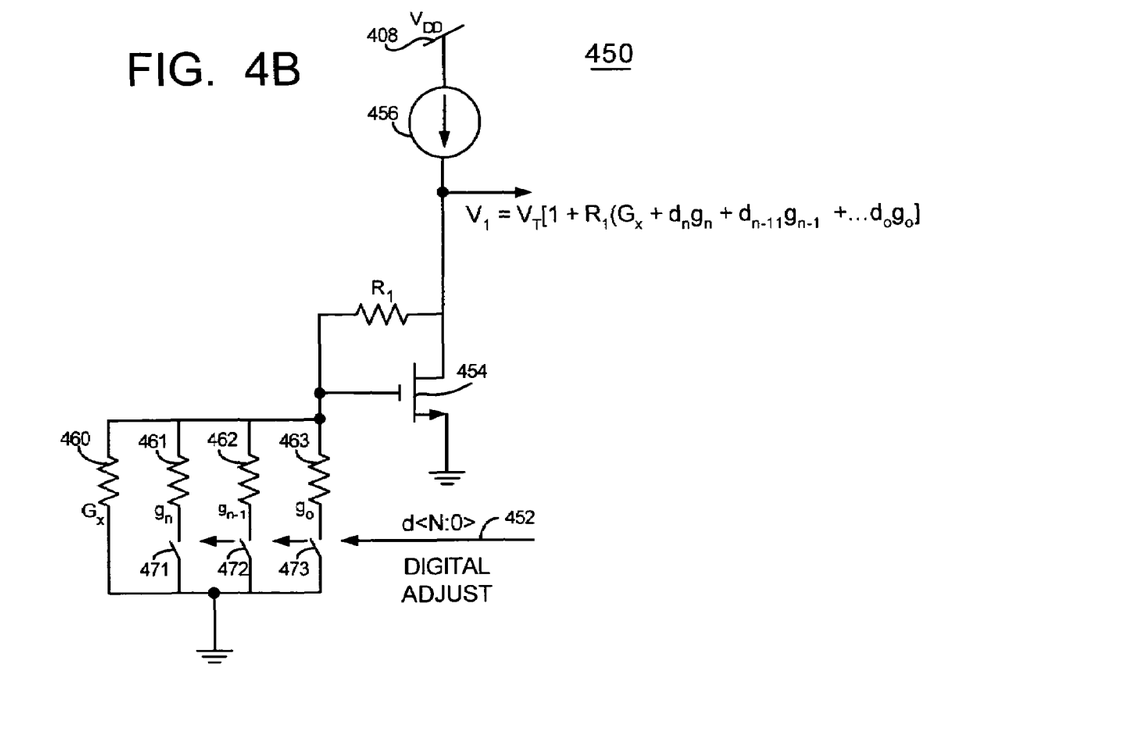
FIG. 4B is a schematic diagram of an adjustable voltage source that can be used in the disclosed bias system.

FIG. 4B is a schematic diagram of a digitally adjustable voltage source 450 which is supplied a CALCODE signal 452, the value of which controls the output voltage, V1, of voltage source 450. In this embodiment, voltage source 450 is a $V_T$ circuit because the output voltage, $V_1$, is dependent on the transition voltage, $V_T$, of MOSFET 454. MOSFET 454 is coupled in series with a current source 456. Series coupled MOSFET 454 and current source 456 are coupled between power rail 408 and ground as shown. A fixed value conductor 460 is coupled between the gate of MOSFET 454 and ground. The value of fixed conductor 460 coarsely sets the output voltage, $V_1$, of adjustable voltage source 450. A bank of conductors 461, 462 and 463 are selectively switchably connected in parallel with conductor 460 to adjust the output voltage, $V_1$, to the voltage value desired as instructed by the digital adjust CALCODE signal 452. More switchable conductors than the 3 shown in FIG. 4B can be used to achieve greater resolution or granularity in adjusting the magnitude of output voltage, $V_1$. Conductors 461, 462, 463 each have a respective switch 471, 472, 473 in series therewith to control whether or not the corresponding conductor is switched into the circuit to affect the final value of the output voltage, $V_1$. A different bit of the CALCODE signal 452 is assigned to each switch respectively to determine whether or not that switch is closed. The output voltage, $V_1$, of this digitally adjustable $V_T$ circuit is given by the equation:

$$V_1 = V_T[1 + R_1(G_x + d_n g_n + d_{n-1} g_{n-1} + \ldots d_o g_o)]$$

wherein $V_T$ is the transition voltage of MOSFET 454 and $G_x$ is the conductance of conductor 460, d is the CALCODE bit corresponding to the particular conductance and g is the conductance value of the conductor to which the respective CALCODE bit is to be applied. As mentioned earlier, the CALCODE bit corresponding to each conductor determines whether or not the switch corresponding to that conductor is turned on to affect the final output voltage value, $V_1$.

Recapitulating, FIG. 4A has shown an adjustable current source that is inherently low noise and which would be inaccurate but for the calibration feature provided by the conductors that can be switched in and out in accordance with the CALCODE signal to drive the current source to a desired output current value. In a similar manner, FIG. 4B has shown an adjustable voltage source that is inherently low noise and which would be inaccurate but for the calibration feature provided by the conductors that can be switched in and out in accordance with the CALCODE signal to drive the voltage source to a desired output voltage value. Both of these sources can be calibrated to be very accurate by using the techniques which are described herein. It is noted that the low noise adjustable voltage source 450 of FIG. 4B can be used as a voltage source $V_T$ circuit within the master source circuit source 331 shown in FIG. 3 and which is shown below in detail in FIG. 7. The same low noise adjustable voltage source 450 can be used as a voltage source $V_T$ circuit in slave source circuit 341 shown in FIG. 3 and which is later shown in more detail in FIG. 8. Alternatively, the low noise adjustable current source 400 of FIG. 4A can be used as a current source $V_T$ circuit within the master source circuit 331 shown in FIG. 3 and which is shown below in detail in FIG. 7. The same low noise adjustable current source 400 can be used as a current source $V_T$ circuit in slave source circuit 341 shown in FIG. 3 and which is later shown in more detail in FIG. 8.

Figure 5:
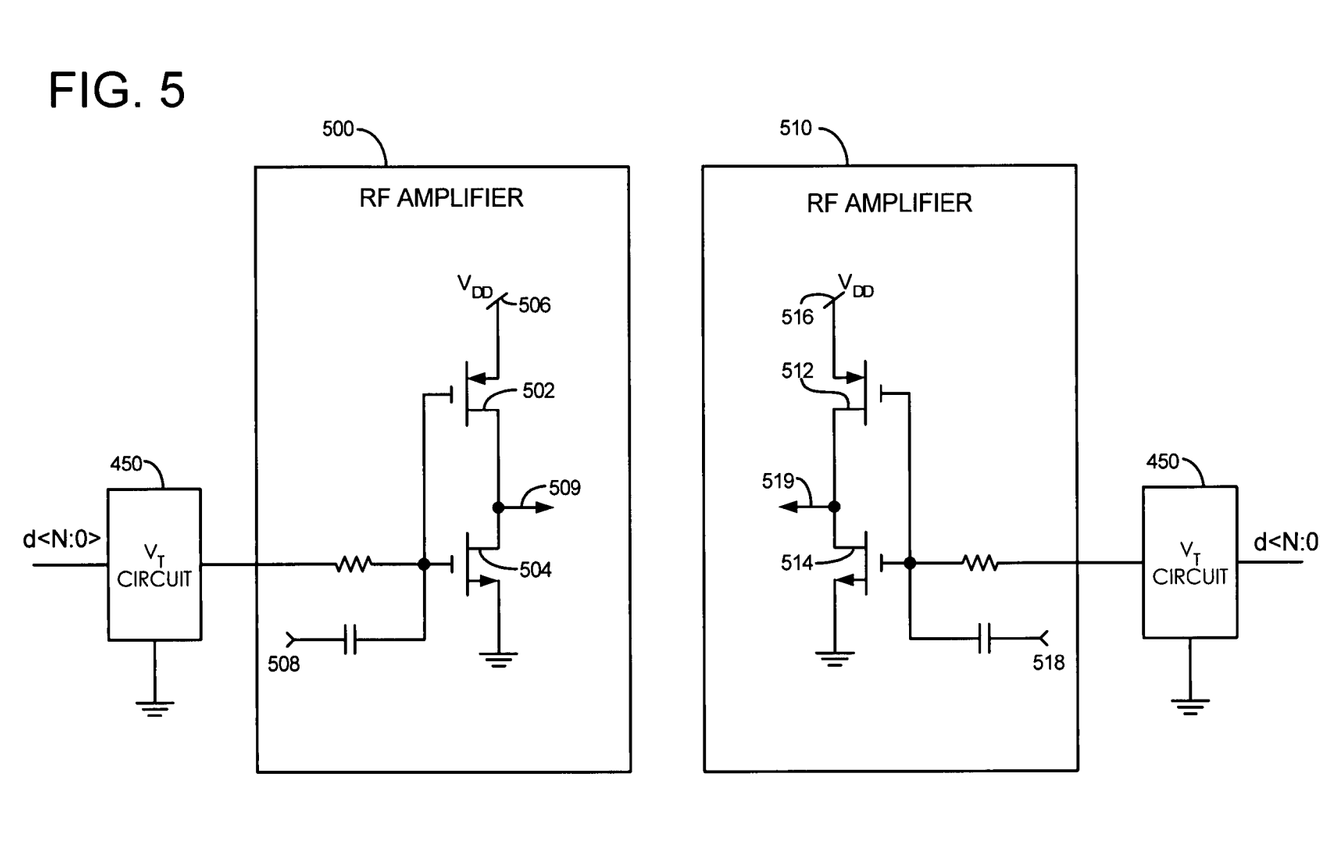
FIG. 5 shows a pair of RF amplifiers coupled to adjustable bias circuits.

FIG. 5 shows how two $V_T$ voltage sources 450 can be coupled to bias respective RF amplifiers 500 and 510 and yet maintain high isolation therebetween. Amplifier 500 includes 2 stacked MOSFETs 502 and 504 which are coupled between power rail 506 and ground as shown. Amplifier 500 includes an input 508 and an output 509. Amplifier 510 includes 2 stacked MOSFETs 512 and 514 that are coupled between power rail 516 and ground as shown. Amplifier 510 includes an input 518 and an output 519. The particular CALCODE signals (d<N:0>) supplied to the respective inputs of the $V_T$ circuit 450 coupled to amplifier 500 and the $V_T$ circuit 450 coupled to amplifier 510 determines the actual voltage bias provided to these amplifiers. If the same CALCODE signal is provided to each $V_T$ circuit, then both $V_T$ circuits will provide the same bias voltage to the respective amplifiers. If different CALCODE signals are provided to each $V_T$ circuit, then a different bias voltage will be provided to each of amplifiers 500 and 510. In either case, the bias provided to each of amplifiers 500 and 510 will not result in undesired coupling between the amplifiers due to bias leakage effects.

Figure 6:
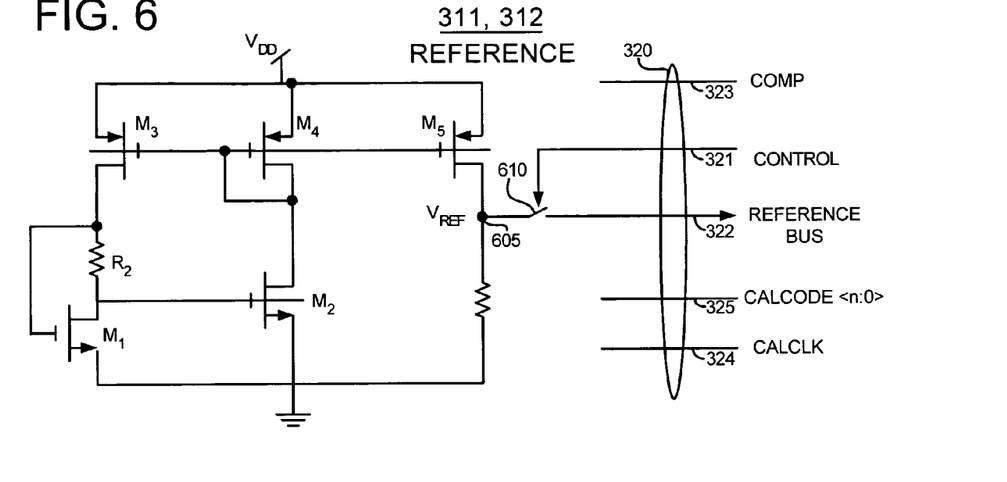
FIG. 6 is a schematic diagram of a voltage reference source used in the disclosed bias system.

FIG. 6 is a schematic diagram of one type of reference circuit that can be used as reference circuit 311 or 312 of bias system 300 depicted above in FIG. 3. Reference 311 is known as a $V_{ON}$ circuit. Reference circuit 311 is an accurate circuit that can be used for calibrating master source circuit 331 and 332 of FIG. 3. In this particular embodiment, reference circuit 311 is a voltage reference circuit although in other applications a current source can be used if current biasing is desired rather than voltage biasing. The difference of $V_{GS}$ for FETs $M_1$ and $M_2$ is placed across resistor $R_2$. If the current densities of FETs $M_1$ and $M_2$ have an appropriate ratio, this difference of $V_{GS}$ is $V_{ON}$. The current flowing through resistor $R_2$ is thus $V_{ON}/R_2$. FET devices $M_3$, $M_4$ and $M_5$ mirror this current to device $M_1$ and output 605. Reference circuit 311 generates a stable, accurate reference voltage, $V_{REF}$, at output 605. Reference circuit 311 includes a switch 610 coupled to output 605 so that the $V_{REF}$ output voltage can be transmitted to, or disconnected from, reference bus 322 under the control of digital controller 330 (not shown in this view). Reference circuit 311 is connected to calibration bus 320 (shown previously in FIG. 3) by control line 321 and reference bus 322.

Figure 7:
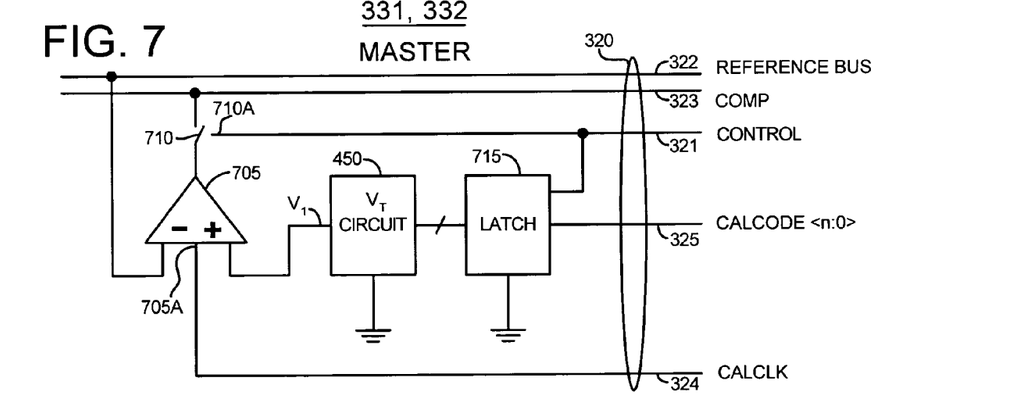
FIG. 7 is a block diagram of an adjustable master voltage source used in the disclosed bias system.

FIG. 7 is a block diagram of one type of master source circuit which can be used as master source circuits 331 and 332 of bias system 300 of FIG. 3. In this particular embodiment, master source circuit 331 is a voltage source circuit although in other applications a current source circuit version can be used if current biasing is desired. Master source circuit 331 is an adjustable source circuit because its output voltage signal, labelled $V_1$, is adjusted by the CALCODE digital adjust signal supplied to CALCODE input 325 by digital controller 350. Master source circuit 331 includes an adjustable voltage source such as the $V_T$ adjustable voltage source circuit 450 shown above in FIG. 4B. The $V_1$ voltage output of $V_T$ circuit 450 is coupled to the non-inverting input of a comparator 705. The clock input 705A of comparator 705 is coupled to the CALCLK line 324 of calibration bus 320. The inverting input of comparator 705 is coupled to reference bus 322 to receive the output signal of one of references 311 and 312 as directed by digital controller 350. The output of comparator 705 is coupled via switch 710 to the COMP line 323 of calibration bus 320. Switch 710 includes a control input 710A which is coupled to the CONTROL line 323 of calibration bus 320 so that digital controller 350 can control when the COMP signal, which is the digital error polarity signal value produced by master 331, is output on COMP line 323. Providing the comparator output signal to COMP line 323 enables digital controller 350 to monitor the error polarity of master 331 while it is being calibrated by the CALCODE signal. A latch 715 is coupled between the CALCODE input 325 and the input of $V_T$ circuit 450 so that the CALCODE signal can be latched and held after the calibration process is completed. It will be recalled that the CALCODE signal is the digital adjust signal which instructs $V_T$ circuit 450 to adjust its output voltage to equal the voltage on reference bus 322. Using a successive approximation routine, digital controller 350 sends $V_T$ circuit 450 a series of codes until it succeeds in driving the voltage output of comparator 705 to a value equal to the voltage on reference bus line 322 which is provided to the inverting input of comparator 705. When digital controller 350 succeeds in driving that voltage output to the desired output voltage, digital controller saves the CALCODE signal value which achieved this result. The same CALCODE signal value will be used later to instruct slave circuits to output the same desired output voltage. It is noted that in embodiments where currents are being calibrated instead of voltages, a current comparator can be used for comparator 705 or currents can be converted to voltages (for example, with a resistor) so that a voltage comparator can be used instead of a current comparator.

Figure 8:
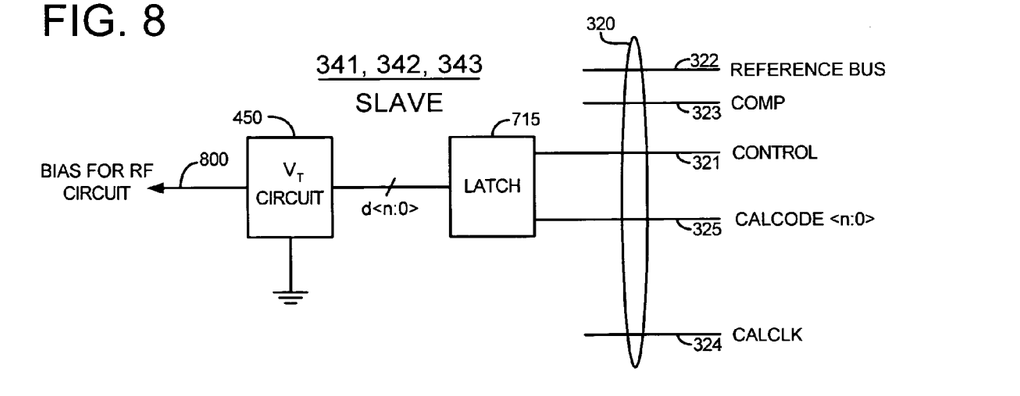
FIG. 8 is a block diagram of an adjustable slave voltage source used in the disclosed bias system.

FIG. 8 is a block diagram of a slave source circuit which can be used as slave source circuits 341, 342 and 343 of bias system 300 of FIG. 3. In this particular embodiment, slave source circuit 341 is a voltage source circuit although in other applications a current source circuit version can be used if current biasing is desired. Slave source circuit 341 is configured to generate the same output voltage as master source circuit 331 produced when the same CALCODE signal was applied thereto in the previously described master calibration. For example, if a CALCODE signal 1010011 applied to master source circuit 331 results in an output voltage of 1 volt by master source circuit 331, then when the same CALCODE signal is applied to slave source circuit 341 via CALCODE bus 325, slave source circuit 341 will also generate a voltage signal exhibiting 1 volt at its output 800. In the embodiment illustrated in FIG. 8, slave source circuit 341 conveniently employs the same $V_T$ circuit 450 and latch 715 as master source circuit 331 employed in FIG. 7. In slave source circuit 341, control line 321 of calibration bus 320 is coupled to latch 715. The CALCODE bus 325 is also coupled to latch 715 so that the CALCODE signal from the CALCODE bus can be stored therein for application to VT circuit 450. When the CALCODE signal from latch 715 is applied to $V_T$ circuit 450, the output voltage exhibited by $V_T$ circuit 450 changes to the desired voltage value specified in the CALCODE, namely 1 volt in this particular example.

Figure 9:
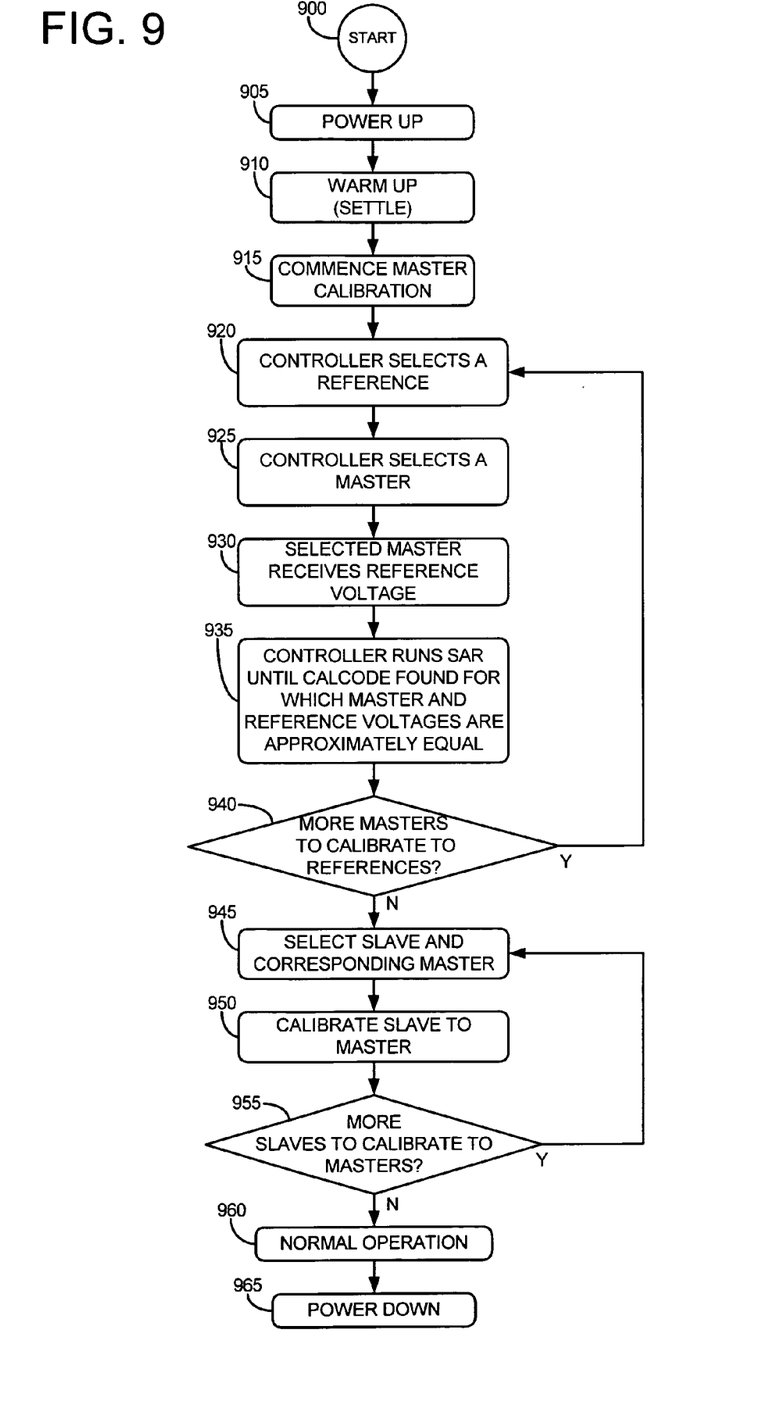
FIG. 9 is a flowchart depicting process flow in the disclosed bias system.

FIG. 9 is a flowchart which depicts the operation of bias system 300 including digital controller 350 with its SAR state machine, reference source circuits 311, 312, master source circuits 331, 332 and slave source circuits 341, 342 and 343. It is helpful to reference the block diagram of bias system 300 shown in FIG. 3 during this discussion of the flowchart of FIG. 9. Bias system 300 commences operation at start block 900. Bias system 300 is powered up at block 905. The reference and master source circuits are allowed time to warm up or settle as per block 910. Master calibration commences at block 915. In block 920 controller 350 selects a particular reference source circuit (e.g. 311) the output voltage of which is to be used to calibrate the output voltage of a selected master source circuit (e.g. 331). The actual selection of a particular reference, master or slave is accomplished by controller 350 sending an appropriate control signal over a dedicated line designated collectively as CONTROL line 321 to that particular reference, master or slave. The output voltage of reference 311 is supplied to reference line 322. With the particular reference already being selected, the target master is selected which is to be calibrated to that reference's voltage as per block 925. The selected master, for example master 331, receives the reference voltage as per block 930. Using a successive approximation routine, controller 350 sends a series of CALCODE codes or words to master 331. As per block 935, controller 350 observes the digital error polarity signal of master 331 over the calibration bus 320 and keeps sending CALCODE codes to master 331 until a CALCODE code is found for which the output voltage of master 331 is approximately equal to the output voltage of reference 311.

After master 331 is calibrated as described above, a test is conducted at decision block 940 to determine if there are other masters to be calibrated. In this particular example, another master is present needing calibration, namely next master 332. Process flow then reverts back to block 920 at which the controller selects a particular reference for the next master to be calibrated. It is noted that the next master 332 can be calibrated to either the same reference as the last master or to a different reference. For example purposes, it is assumed that next master 332 is to be calibrated to a different reference, namely to the output voltage of reference 312. Process flow then continues as before with controller 350 using a successive approximation routine to send a series of CALCODE codes to master 332 until the output voltage of master 332 is equal to the output voltage of reference 312.

A test is again conducted at decision block 940 to determine if there are any more masters to calibrate. In this particular embodiment where there are 2 masters, there are no more masters to calibrate since both master 331 and 332 have already been calibrated. Therefore process flow now continues forward from the "N" (No) branch of decision block 940.

Controller 350 now selects a slave and a master to which the selected slave is to be calibrated as per block 945. The slave is selected by controller 350 sending a signal to the target slave over the CONTROL line 321. For example purposes, it is assumed that slave 341 is selected and master 331 is selected. Controller 350 seeks to cause slave 341 to exhibit the same output voltage as master 331. To achieve this, controller 350 sends slave 341 the same CALCODE code that it sent to master 331 earlier to cause master 331 to output the desired voltage as per block 950. Slave 341 is thus calibrated to the output voltage exhibited earlier by master 331 which itself was calibrated with respect to the voltage of reference 311. In this manner, slave 341 is caused to exhibit an output voltage calibrated back to the voltage of reference 311.

A test is conducted at decision block 955 to determine if there are any other slaves left needing calibration. In this particular example, there are 2 slaves remaining that need calibration, namely slaves 342 and 343. For illustration purposes, it is assumed that both slaves 342 and 343 are selected to be calibrated to the same master, namely master 332. To accomplish this, controller 350 sends slaves 342 and 343 the same CALCODE code over calibration bus 320 that it sent to master 332 earlier to cause master 332 to output the desired voltage. Slaves 342 and 343 are thus both calibrated to the output voltage exhibited earlier by the same master 332 which itself was calibrated with respect to the output voltage of reference 312. In this manner, slaves 342 and 343 are caused to exhibit an output voltage calibrated back to the voltage of reference 312. A test is conducted at decision block 955 to see if there are any more slaves requiring calibration. No additional slaves needing calibration are found and thus decision block 955 is exited at its "N" (No) branch and process flow continues forward. The particular circuits which bias system 300 is biasing then commence normal operation using the calibrated bias voltages just described as per block 960. When operation is complete, the biased circuits and bias system 300 are powered down as per block 965.

Figure 10:
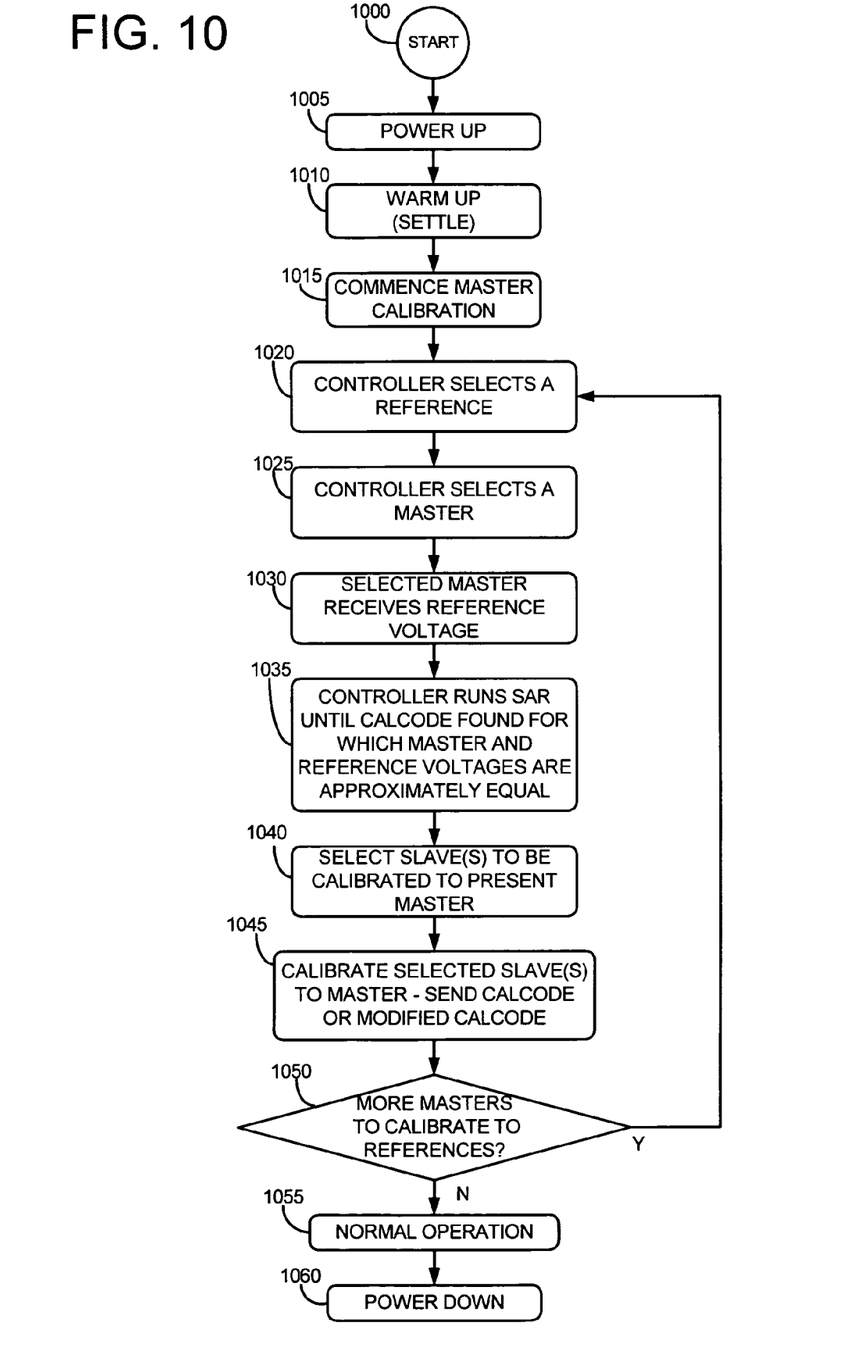
FIG. 10 is a flowchart depicting another process flow in the disclosed bias system.

FIG. 10 is a flowchart which depicts another method of operating bias system 300 including digital controller 350 with its SAR state machine, reference source circuits 311, 312, master source circuits 331, 332 and slave source circuits 341, 342 and 343. It is again helpful to refer to the block diagram of bias system 300 shown in FIG. 3 during this discussion of the flowchart of FIG. 10. Process flow in the flowchart of FIG. 10 is initially similar to process flow in the flowchart of FIG. 9 with blocks 1000–1035 of FIG. 10 being similar to blocks 900–935 of FIG. 9.

Bias system 300 commences operation at start block 1000. Bias system 300 is powered up at block 1005. The reference and master source circuits are allowed time to warm up or settle as per block 1010. Master calibration commences at block 1015. In block 1020 controller 350 selects a particular reference source circuit (e.g. 311) the output voltage of which is to be used to calibrate the output voltage of a selected master source circuit (e.g. 331). The actual selection of a particular reference, master or slave is accomplished by controller 350 sending an appropriate control signal over a dedicated line designated collectively as CONTROL line 321 to that particular reference, master or slave. The output voltage of reference 311 is supplied to reference line 322. With the particular reference already being selected, the target master is selected which is to be calibrated to that reference's voltage as per block 1025. The selected master, for example master 331, receives the reference voltage as per block 1030. Using a successive approximation routine, controller 350 sends a series of CALCODE codes or words to master 331. As per block 1035, controller 350 observes the digital error polarity signal of master 331 over the calibration bus 320 and keeps sending CALCODE codes to master 331 until a CALCODE code is found for which the output voltage of master 331 is approximately equal to the output voltage of reference 311.

After master 331 is calibrated as described above, any slaves 341, 342, . . . etc. to be calibrated to that particular master are sent the present CALCODE to cause the output voltage of the slave or slaves to be approximately equal to the output voltage of the particular master as per block 1040 and 1045. Alternatively, an offset can be added to the CALCODE and then the adjusted or modified CALCODE is broadcast to selected slaves. As another alternative, an old CALCODE from a previous calibration of the particular master can be sent to a selected slave or slaves. Sending an old CALCODE may be desirable when there is a substantial change from a current CALCODE and an old CALCODE such as can occur when the bias circuit is subjected to a substantial temperature change between calibrations. An override value can be sent as the CALCODE in place of the CALCODE of the particular master. As yet another alternative, an old CALCODE can be sent plus an increment of, for example, the least significant bit (LSB) of the CALCODE.

A test is conducted at decision block 1050 to determine if there are any masters remaining to calibrate. If there are remaining masters to calibrate, then process flow continues back to block 1020 and the process starts again for such a master and any slaves needing to be calibrated to that master. When no more masters are found to calibrate at decision block 1050, then normal operation commences using the calibrated bias voltages just described as per block 1055. When operation is complete, the biased circuits and bias system 300 are powered down as per block 1060.

A bias system is thus disclosed which provides both low noise and high accuracy bias to multiple loads. Advantageously, the disclosed bias system provides bias to multiple loads without adding undesired coupling between those loads or stages. One embodiment of the disclosed bias system is adjustable even after the bias system and the loads it supplies are manufactured. This is especially useful in the situation where the bias system and loads are fabricated on a common integrated circuit (IC) such that parasitic and other effects can not be simulated prior to manufacture. Bias can be adjusted after manufacture to compensate for such undesired effects.

Modifications and alternative embodiments of this invention will be apparent to those skilled in the art in view of this description of the invention. Accordingly, this description teaches those skilled in the art the manner of carrying out the invention and are to be construed as illustrative only. The forms of the invention shown and described constitute the present embodiments. Persons skilled in the art may make various changes in the shape, size and arrangement of parts. For example, persons skilled in the art may substitute equivalent elements for the elements illustrated and described here. Moreover, persons skilled in the art after having the benefit of this description of the invention may use certain features of the invention independently of the use of other features, without departing from the scope of the invention.

What is claimed is:

1. A method of supplying bias comprising:
   generating, by a reference bias source, a reference bias signal having a desired bias value;
   calibrating an adjustable master bias source by sending the adjustable master bias source a control code which causes the adjustable master bias source to generate a master bias signal having the desired bias value; and
   calibrating first and second adjustable slave bias sources by sending the control code to the first and second adjustable slave bias sources to cause the first and second adjustable slave bias sources to generate respective first and second slave bias signals having the desired bias value.

2. The method of claim 1 wherein the desired bias value is a voltage.

3. The method of claim 1 wherein the desired bias value is a current.

4. The method of claim 1 further including varying the control code until a control code is found at which the adjustable master bias source has the desired bias value.

5. The method of claim 1 further including coupling the first and second adjustable slave bias sources to respective first and second loads to provide bias thereto.

6. The method of claim 5 wherein the first and second loads are RF circuits.

7. The method of claim 1 further including generating control codes by a digital controller.

8. The method of claim 7 further including transmitting, by the digital controller, control codes over a calibration bus coupling the digital controller to the reference bias source, the adjustable master bias source and the first and second adjustable slave bias sources.

9. The method of claim 1 wherein the reference bias source is accurate but noisy.

10. The method of claim 1 wherein the adjustable master bias source has low noise at an output of the adjustable bias source.

11. The method of claim 1 wherein the first and second adjustable slave bias sources have low noise at their respective outputs.

12. The method of claim 1 wherein a master load is coupled to the adjustable master bias source.

13. The method of claim 1 wherein a control code is reserved for the adjustable master bias source and is not supplied to first and second adjustable slave bias sources.

14. The method of claim 1 wherein the control code is selected to cause the first and second adjustable slave bias sources to have a modified bias value which is different from the desired bias value of the adjustable master bias source.

15. The method of claim 14 wherein the modified bias value is offset with respect to the desired bias value.

16. The method of claim 1 wherein an old control code is used as the control code.

17. A method of supplying bias comprising:
    generating, by a first reference bias source, a first bias signal having a desired first bias value;
    generating, by a second reference bias source, a second bias signal having a desired second bias value;
    calibrating a first adjustable master bias source by sending the first adjustable master bias source a first control code which causes the first adjustable master bias source to generate a first master bias signal having the desired first bias value;
    calibrating a second adjustable master bias source by sending the second adjustable master bias source a second control code which causes the second adjustable master bias source to generate a second master bias signal having the desired second bias value; and
    calibrating first and second adjustable slave bias sources by sending the first and second control codes to the first and second adjustable slave bias sources, respectively, to cause the first and second adjustable slave bias sources to having the desired first and second bias values, respectively.

18. The method of claim 17 wherein the desired first bias value is a voltage.

19. The method of claim 17 wherein the desired second bias value is a current.

20. The method of claim 17 further including varying the first control code sent to the first adjustable bias source until a control code is found at which the first adjustable master bias source has the desired first bias value.

21. The method of claim 17 further including varying the second control code sent to the second adjustable bias source until a control code is found at which the second adjustable master bias source has the desired second bias value.

22. The method of claim 17 further including coupling the first and second adjustable slave bias sources to respective first and second loads to provide bias thereto.

23. The method of claim 22 wherein the first and second loads are RF circuits.

24. The method of claim 17 further including generating the control codes by a digital controller.

25. The method of claim 24 further including transmitting, by the digital controller, control codes over a calibration bus coupling the digital controller to the first and second reference bias sources, the first and second adjustable master bias sources and the first and second adjustable slave bias sources.

26. The method of claim 17 wherein the first and second reference bias sources are accurate but noisy.

27. The method of claim 17 wherein the first and second adjustable master bias sources have low noise at their respective outputs.

28. The method of claim 17 wherein the first and second adjustable slave bias sources have low noise at their respective outputs.

29. The method of claim 17 wherein a master load is coupled to the adjustable master bias source.

30. The method of claim 17 wherein a control code is reserved for the adjustable master bias source and is not supplied to first and second adjustable slave bias sources.

31. The method of claim 17 wherein the control code is selected to cause the first and second adjustable slave bias sources to have a modified bias value which is different from the desired bias value of the adjustable master bias source.

32. The method of claim 31 wherein the modified bias value is offset with respect to the desired bias value.

33. The method of claim 17 wherein an old control code is used as the control code.

34. A method of supplying bias comprising:
    generating, by a reference bias source, a reference bias signal having a desired bias value;
    calibrating an adjustable master bias source by sending the adjustable master bias source a control code which causes the adjustable master bias source to generate a master bias signal having the desired bias value; and calibrating an adjustable slave bias source by sending the control code to the adjustable slave bias source to cause adjustable slave bias source to generate a slave bias signal having the desired bias value.

35. The method of claim 34 wherein the desired bias value is a voltage.

36. The method of claim 34 wherein the desired bias value is a current.

37. The method of claim 34 further including varying the control code until a control code is found at which the adjustable master bias source has the desired bias value.

38. The method of claim 34 further including coupling the adjustable slave bias source to a first load to provide bias thereto.

39. The method of claim 34 further including generating control codes by a digital controller.

40. The method of claim 34 wherein the reference bias source is accurate but noisy.

41. The method of claim 34 wherein the adjustable master bias source has low noise at an output of the adjustable bias source.

42. The method of claim 34 wherein the adjustable slave bias source has low noise at its output.

43. The method of claim 34 wherein a master load is coupled to the adjustable master bias source.

44. The method of claim 34 wherein a control code is reserved for the adjustable master bias source and is not supplied to the adjustable slave bias source.

45. The method of claim 34 wherein the control code is selected to cause the adjustable slave bias source to have a modified bias value which is different from the desired bias value of the adjustable master bias source.

46. The method of claim 45 wherein the modified bias value is offset with respect to the desired bias value.

47. The method of claim 34 wherein an old control code is used as the control code.

48. A bias system comprising:
a calibration bus;
a reference bias source, coupled to the calibration bus, that generates a bias signal having a desired bias value;
an adjustable master bias source, coupled to the calibration bus, that receives a control code which causes the adjustable master bias source to generate a master bias signal having the desired bias value; and
first and second adjustable slave bias sources, coupled to the calibration bus, that receive the control code to cause the first and second adjustable slave bias sources to generate respective first and second slave bias signals having the desired bias value.

49. The bias system of claim 48 further including a controller, coupled to the calibration bus, that generates the control code.

50. The bias system of claim 49 wherein the controller varies the control code until the adjustable master bias source generates a master bias signal having the desired bias value.

51. The bias system of claim 48 wherein the desired bias value is a voltage.

52. The bias system of claim 48 wherein the desired bias value is a current.

53. The bias system of claim 48 wherein the reference bias source is accurate but noisy.

54. The bias system of claim 48 wherein the adjustable master bias source has low noise at an output of the adjustable bias source.

55. The bias system of claim 48 wherein the first and second adjustable slave bias sources have low noise at their respective outputs.

56. The bias system of claim 48 wherein a master load is coupled to the adjustable master bias source.

57. The bias system of claim 48 wherein a control code is reserved for the adjustable master bias source and that control code is not supplied to first and second adjustable slave bias sources.

58. The bias system of claim 48 wherein the control code is selected to cause the first and second adjustable slave bias sources to have a modified bias value which is different from the desired bias value of the adjustable master bias source.

59. The bias system of claim 58 wherein the modified bias value is offset with respect to the desired bias value.

60. The bias system of claim 48 wherein an old control code is used as the control code.

61. A bias system comprising:
a calibration bus;
first and second reference bias sources, coupled to the calibration bus, that generate first and second bias signals, respectively, the first and second bias signals having first and second desired bias values, respectively;
first and second adjustable master bias sources, coupled to the calibration bus, that receive first and second control codes, respectively, which cause the first and second adjustable master bias sources to respectively generate a first master bias signal having the first desired bias value and a second master bias signal having the second desired bias value; and
first and second adjustable slave bias sources, coupled to the calibration bus, that receive the first and second control codes, respectively, to cause the first and second adjustable slave bias sources to respectively generate a first slave bias signal having the first desired bias value and a second slave bias signal having the second desired slave bias value.

62. The bias system of claim 61 further including a controller, coupled to the calibration bus, that generates control codes and sending control codes over the calibration bus.

63. The bias system of claim 62 wherein the controller varies the control code received by the first adjustable master bias source until the first control code is found which causes the first adjustable master bias source to have the first desired bias value.

64. The bias system of claim 63 wherein the controller varies the control code received by the second adjustable master bias source until the second control code is found which causes the second adjustable master bias source to have the second desired bias value.

65. The bias system of claim 62 wherein the controller sends the first and second control codes over the calibration bus to the first and second adjustable slave bias sources, respectively.

66. The bias system of claim 61 wherein the desired bias value is a voltage.

67. The bias system of claim 61 wherein the desired bias value is a current.

68. The bias system of claim 61 wherein the first and second reference bias sources are accurate but noisy.

69. The bias system of claim 61 wherein the first and second adjustable master bias sources have low noise at their respective outputs.

70. The bias system of claim 61 wherein the first and second adjustable slave bias sources have low noise at their respective outputs.

71. A bias system comprising:
a calibration bus;
a reference bias source, coupled to the calibration bus, that generates a bias signal having a desired bias value;
an adjustable master bias source, coupled to the calibration bus, that receives a control code which causes the adjustable master bias source to generate a master bias signal having the desired bias value; and
an adjustable slave bias source, coupled to the calibration bus, that receives the control code to cause the adjustable slave bias source to generate a slave bias signal having the desired bias value.

72. The bias system of claim 71 further including a controller, coupled to the calibration bus, that generates the control code.

73. The bias system of claim 72 wherein the controller varies the control code until the adjustable master bias source generates a master bias signal having the desired bias value.

74. The bias system of claim 71 wherein the desired bias value is a voltage.

75. The bias system of claim 71 wherein the desired bias value is a current.

76. The bias system of claim 71 wherein the reference bias source is accurate but noisy.

77. The bias system of claim 71 wherein the adjustable master bias source has low noise at an output of the adjustable bias source.

78. The bias system of claim 71 wherein the adjustable slave bias source has low noise at its output.

79. An integrated circuit device comprising:
a calibration bus;
a reference bias source, coupled to the calibration bus, that generates a bias signal having a desired bias value;
an adjustable master bias source, coupled to the calibration bus, that receives a control code which causes the adjustable master bias source to generate a master bias signal having the desired bias value;
first and second adjustable slave bias sources, coupled to the calibration bus, that receive the control code to cause the first and second adjustable slave bias sources to generate respective first and second slave bias signals having the desired bias value; and
first and second loads coupled to the first and second adjustable slave bias sources, respectively.

80. The integrated circuit device of claim 79 further including a controller, coupled to the calibration bus, that generates the control code.

81. The integrated circuit device of claim 80 wherein the controller varies the control code until the adjustable master bias source exhibits a master bias signal having the desired bias value.

82. The integrated circuit device of claim 79 wherein the desired bias value is a voltage.

83. The integrated circuit device of claim 79 wherein the desired bias value is a current.

84. The integrated circuit device of claim 79 wherein the first and second loads are RF circuits.

85. The integrated circuit device of claim 79 wherein a master load is coupled to the adjustable master bias source.

86. The integrated circuit device of claim 79 wherein a control code is reserved for the adjustable master bias source and that control code is not supplied to first and second adjustable slave bias sources.

87. The integrated circuit device of claim 79 wherein the control code is selected to cause the first and second adjustable slave bias sources to have a modified bias value which is different from the desired bias value of the adjustable master bias source.

88. The integrated circuit device of claim 87 wherein the modified bias value is offset with respect to the desired bias value.

89. The integrated circuit device of claim 79 wherein an old control code is used as the control code.

90. An integrated circuit device comprising:
a calibration bus;
first and second reference bias sources, coupled to the calibration bus, that generate first and second bias signals, respectively, the first and second bias signals having first and second desired bias values, respectively;
first and second adjustable master bias sources, coupled to the calibration bus, that receive first and second control codes, respectively, which cause the first and second adjustable master bias sources to respectively generate a first master bias signal having the first desired bias value and a second master bias signal having the second desired bias value;
first and second adjustable slave bias sources, coupled to the calibration bus, that receive the first and second control codes, respectively, to cause the first and second adjustable slave bias sources to respectively generate a first slave bias signal having the first desired bias value and a second slave bias signal having the second desired slave bias value; and
first and second loads coupled to the first and second adjustable slave bias sources, respectively.

91. The integrated circuit device of claim 90 further including a controller, coupled to the calibration bus, that generates control codes and sends control codes over the calibration bus.

92. The integrated circuit device of claim 91 wherein the controller varies the control code received by the first adjustable master bias source until the first control code is found which causes the first adjustable master bias source to have the first desired bias value.

93. The integrated circuit device of claim 91 wherein the controller varies the control code received by the second adjustable master bias source until the second control code is found which causes the second adjustable master bias source to have the second desired bias value.

94. The integrated circuit device of claim 91 wherein the controller sends the first and second control codes over the calibration bus to the first and second adjustable bias source, respectively.

95. The integrated circuit device of claim 90 wherein the desired bias value is a voltage.

96. The integrated circuit device of claim 90 wherein the desired bias value is a current.

* * * * *